(12) United States Patent
Parker et al.

(10) Patent No.: US 7,307,429 B1
(45) Date of Patent: Dec. 11, 2007

(54) APPARATUS FOR TESTING AN ARC FAULT CIRCUIT INTERRUPTER

(75) Inventors: Kevin L. Parker, Pittsburgh, PA (US); Dale L. Gass, Brown Deer, WI (US); Jerome K. Hastings, Sussex, WI (US)

(73) Assignee: Eaton Corporation, Cleveland, OH (US)

( * ) Notice: Subject to any disclaimer, the term of this patent is extended or adjusted under 35 U.S.C. 154(b) by 0 days.

(21) Appl. No.: 11/489,036

(22) Filed: Jul. 19, 2006

(51) Int. Cl.
*G01R 31/12* (2006.01)
*H02H 3/00* (2006.01)

(52) U.S. Cl. ........................................ 324/536; 361/42
(58) Field of Classification Search ................ 324/536; 361/42
See application file for complete search history.

(56) References Cited

U.S. PATENT DOCUMENTS

| | | |
|---|---|---|
| 5,224,006 A | 6/1993 | MacKenzie et al. |
| 5,691,869 A | 11/1997 | Engel et al. |
| 2004/0100274 A1* | 5/2004 | Gloster et al. ............. 324/536 |
| 2006/0214670 A1* | 9/2006 | Naidu et al. ................ 324/536 |

OTHER PUBLICATIONS

Motor Capacitors, Inc., "What Does A Capacitor Do In A Capacitor Start Motor To Make It Start?", http://www.capacitorindustries.com/Tutorials/Motor%20Starting%20Capacitors.htm, Apr. 5, 2005, 1 p.
Foutz, J., "Switching-Mode Power Supply Design Introduction", http://www.smpstech.com/tutorial/t01int.htm, Dec. 9, 1998, 4 pp.

* cited by examiner

*Primary Examiner*—Vincent Q. Nguyen
(74) *Attorney, Agent, or Firm*—Martin J. Moran

(57) ABSTRACT

A test apparatus tests an arc fault circuit breaker with an arc fault generator having an input and an output. The test apparatus includes a first electrical connector electrically connected to the load side of an arc fault circuit interrupter. A second electrical connector is electrically connected to the input of the arc fault generator. A third electrical connector is electrically connected to the output of the arc fault generator. A plurality of fourth electrical connectors are electrically connected to one or more of a plurality of masking loads. A fifth electrical connector is electrically connected to another load. A two pole, plural position rotary selector switch provides a plurality of different configurations of at least the arc fault generator and the one or more masking loads downstream of the load side of the arc fault circuit breaker.

21 Claims, 3 Drawing Sheets

APPARATUS FOR TESTING AN ARC FAULT CIRCUIT INTERRUPTER

BACKGROUND OF THE INVENTION

1. Field of the Invention

This invention pertains generally to test apparatus and, more particularly, to a test apparatus for testing an arc fault circuit interrupter, such as, for example, an arc fault circuit breaker.

2. Background Information

Arcing is a luminous discharge of electricity across an insulating medium, usually accompanied by the partial volatilization of electrodes. An arc fault is an unintentional arcing condition in an electrical circuit. Arc faults can be caused, for instance, by worn insulation between adjacent bared conductors, by exposed ends between broken conductors, by faulty electrical connections, and in other situations where conducting elements are in close proximity.

Arc faults in systems can be intermittent since the magnetic repulsion forces generated by the arc current force the conductors apart to extinguish the arc. Mechanical forces then bring the conductors together again in order that another arc is struck.

Circuit interrupters include, for example, circuit breakers, contactors, motor starters, motor controllers, other load controllers and receptacles having a trip mechanism. Circuit breakers are generally old and well known in the art. Circuit breakers are used to protect electrical circuitry from damage due to an overcurrent condition, such as an overload condition or a relatively high level short circuit or fault condition. In small circuit breakers, commonly referred to as miniature circuit breakers, used for residential and light commercial applications, such protection is typically provided by a thermal-magnetic trip device. This trip device includes a bimetal, which is heated and bends in response to a persistent overcurrent condition. The bimetal, in turn, unlatches a spring powered operating mechanism, which opens the separable contacts of the circuit breaker to interrupt current flow in the protected power system. An armature, which is attracted by the sizable magnetic forces generated by a short circuit or fault, also unlatches, or trips, the operating mechanism.

Recently, there has been considerable interest in providing protection against arc faults. Because of their intermittent and high impedance nature, arc faults do not generate currents of either sufficient instantaneous magnitude or sufficient average RMS current to trip the conventional circuit interrupter. Even so, the arcs can cause damage or start a fire if they occur near combustible material. It is not practical to simply lower the pick-up currents on conventional circuit breakers, as there are many typical loads, which draw similar currents and would, therefore, cause nuisance trips. Consequently, separate electrical circuits have been developed for responding to arc faults. See, for example, U.S. Pat. Nos. 5,224,006; and 5,691,869.

For example, an arc fault circuit interrupter (AFCI) is a device intended to mitigate the effects of arc faults by functioning to deenergize an electrical circuit when an arc fault is detected. Non-limiting examples of AFCIs include: (1) arc fault circuit breakers; (2) branch/feeder arc fault circuit interrupters, which are intended to be installed at the origin of a branch circuit or feeder, such as a panelboard, and which may provide protection from ground faults (e.g., greater than 40 mA) and line-to-neutral faults (e.g., greater than 75 A); (3) outlet circuit arc fault circuit interrupters, which are intended to be installed at a branch circuit outlet, such as an outlet box, in order to provide protection of cord sets and power-supply cords connected to it (when provided with receptacle outlets) against the unwanted effects of arcing, and which may provide protection from line-to-ground faults (e.g., greater than 75 A) and line-to-neutral faults (e.g., 5 to 30 A, and greater than 75 A); (4) cord arc fault circuit interrupters, which are intended to be connected to a receptacle outlet, in order to provide protection to an integral or separate power supply cord; (5) combination arc fault circuit interrupters, which function as either a branch/feeder or an outlet circuit AFCI; and (6) portable arc fault circuit interrupters, which are intended to be connected to a receptacle outlet and provided with one or more outlets.

UL 1699 is a specification that governs the performance of AFCI products including branch/feeder type (AVZQ); outlet circuit type (AWCG); portable type (AWDO); cord type (AWAY); and combination type (AWAH) AFCIs.

UL 1699 requires that AFCIs be tested with a series of "masking load" configurations. However, switching between these multiple test configurations is tedious and repetitious and, thus, is prone to error.

UL 1699 also requires that a series of "masking tests" be conducted with the following loads: (1) a vacuum cleaner; (2) one or more electronic switching mode power supplies; (3) a capacitor start (air compressor type) motor; (4) a 1000 W electronic lamp dimmer load and a 600 W electronic lamp dimmer load (which must be tested separately); and (5) two 40 W fluorescent lamps plus an additional 5 A resistive load.

FIGS. 1-4 show test configurations A-D, respectively. The series of "masking tests" for each load involves these four test configurations: (1) configuration A: the arc fault tester 2 (i.e., arc generator) is in series with the masking load 4; (2) configuration B: the masking load 4 is in parallel with the arc fault tester 2 which is in series with a 5 A resistive load 6; (3) configuration C: the 5 A resistive load 6 is in parallel with the arc fault tester 2 which is in series with the masking load 4; and (4) configuration D: the arc fault tester 2 is in series with the parallel combination of the 5 A resistive load 6 and the masking load 4. In all of the test configurations A-D, a power source 8 is upstream of the line terminal 10 and the line neutral terminal 12 of the line side of an arc fault circuit interrupter (AFCI) 14.

As shown in FIGS. 1 and 4, the load terminal 16 and load neutral terminal 18 are on the load side downstream of the line side of the AFCI 14. The terminals 16 and 18 are respectively electrically connected to the line terminal 20 and the neutral terminal 22 of the arc fault tester 2. The ground terminal 24 of the arc fault tester 2 is electrically connected to a ground 26 associated with the power source 8.

UL 1699 requires 24 unique test configurations (i.e., 6 test loads×4 test configurations=24 test configurations). The tests themselves are relatively simple and quick, but changing between the many test configurations requires plugging and unplugging of various loads, which is tedious, repetitious and time-consuming. It is also easy to configure a test setup incorrectly, which may require repeated testing effort.

Furthermore, if the entire test sequence is performed with three different samples of each load type in order to further check compliance (e.g., without limitation, vacuum cleaners from three different manufacturers; compressors from three different manufacturers), then the total count of test configurations becomes 72 (=24×3).

Moreover, if a particular AFCI (e.g., AFCI 14) under test fails to comply with one or more of the tests, then the AFCI manufacturer must then fix the problem and repeat the test sequence discussed above, in order to ensure that the problem has been fixed and that no new problem(s) have been introduced.

The setups for the various "masking test" configurations required by UL 1699 are repeated many, many times during development, manufacture and testing for an AFCI. Clearly, there is an opportunity to reduce effort associated with testing by simplifying the masking test configuration setup process.

Accordingly, there is room for improvement in test apparatus for testing an arc fault circuit interrupter.

SUMMARY OF THE INVENTION

These needs and others are met by embodiments of the invention, which provide a test apparatus including a selector switch structured to provide a plurality of different configurations of an arc fault generator and one or more masking loads downstream of the load side of an arc fault circuit interrupter.

In accordance with one aspect of the invention, an apparatus is for testing an arc fault circuit interrupter with an arc fault generator having an input and an output, the arc fault circuit interrupter has a line side and a load side downstream of the line side. The apparatus comprises: a first electrical connector structured to be electrically connected to the load side of the arc fault circuit interrupter; a second electrical connector structured to be electrically connected to the input of the arc fault generator; a third electrical connector structured to be electrically connected to the output of the arc fault generator; a plurality of fourth electrical connectors structured to be electrically connected to at least one of a plurality of masking loads; a fifth electrical connector structured to be electrically connected to another load; and a selector switch structured to provide a plurality of different configurations of at least the arc fault generator and the at least one of a plurality of masking loads downstream of the load side of the arc fault circuit interrupter.

The other load may be a resistive load. The selector switch may be structured to provide a plurality of different configurations of the masking loads being upstream of the input of the arc fault generator or downstream of the output of the arc fault generator, and a plurality of different configurations of the resistive load being upstream of the input of the arc fault generator, downstream of the output of the arc fault generator, or not employed with the arc fault generator.

The other load may be a first resistive load. The fourth electrical connectors may be structured to be electrically connected to one of a vacuum cleaner, at least one electronic switching mode power supply, a capacitor start type motor, an electronic lamp dimmer load, and two fluorescent lamps in parallel with a second resistive load.

The selector switch may be structured to electrically connect the arc fault generator downstream of the load side of the arc fault circuit interrupter and to electrically connect the at least one of a plurality of masking loads downstream of the output of the arc fault generator.

The selector switch may be structured to electrically connect the at least one of a plurality of masking loads downstream of the load side of the arc fault circuit interrupter, to electrically connect the arc fault generator downstream of the at least one of a plurality of masking loads and to electrically connect the resistive load downstream of the output of the arc fault generator.

The selector switch may be structured to electrically connect the resistive load downstream of the load side of the arc fault circuit interrupter, to electrically connect the arc fault generator downstream of the resistive load and to electrically connect the at least one of a plurality of masking loads downstream of the output of the arc fault generator.

The selector switch may be structured to electrically connect the arc fault generator downstream of the load side of the arc fault circuit interrupter, to electrically connect the at least one of a plurality of masking loads downstream of the output of the arc fault generator and to electrically connect the resistive load downstream of the output of the arc fault generator.

The selector switch may be a two pole, four position switch including a first pole structured to dispose the at least one of a plurality of masking loads upstream of the input or downstream of the output of the arc fault generator, and a second pole structured to remove the resistive load or to dispose the resistive load upstream of the input or downstream of the output of the arc fault generator, the two pole, four position switch being structured to select one of four configurations of at least the arc fault generator and the at least one of a plurality of masking loads downstream of the load side of the arc fault circuit interrupter.

As another aspect of the invention, an apparatus is for testing an arc fault circuit interrupter with an arc fault generator having an input and an output, the arc fault circuit interrupter has a line side and a load side downstream of the line side. The apparatus comprises: a first electrical connector structured to be electrically connected to the load side of the arc fault circuit interrupter; a second electrical connector structured to be electrically connected to the input of the arc fault generator; a third electrical connector structured to be electrically connected to the output of the arc fault generator; a plurality of fourth electrical connectors structured to be electrically connected to at least one of a plurality of masking loads; a fifth electrical connector structured to be electrically connected to another load; and means for selecting one of a plurality of different configurations of at least the arc fault generator and the at least one of a plurality of masking loads downstream of the load side of the arc fault circuit interrupter.

As another aspect of the invention, an apparatus is for testing an arc fault circuit interrupter with an arc fault generator having an input and an output, the arc fault circuit interrupter has a line side and a load side downstream of the line side. The apparatus comprises: a first electrical connector structured to be electrically connected to the load side of the arc fault circuit interrupter; a second electrical connector structured to be electrically connected to the input of the arc fault generator; a third electrical connector structured to be electrically connected to the output of the arc fault generator; a fourth electrical connector structured to be electrically connected to a resistance; and a selector switch structured to provide a plurality of different configurations of at least the arc fault generator and the resistance downstream of the load side of the arc fault circuit interrupter.

BRIEF DESCRIPTION OF THE DRAWINGS

A full understanding of the invention can be gained from the following description of the preferred embodiments when read in conjunction with the accompanying drawings in which.

DESCRIPTION OF THE PREFERRED EMBODIMENTS

As employed herein, the term "upstream" means in the direction from which power flows in a power circuit, in the direction of or nearer to the power input of an electrical apparatus, and/or in the direction of or nearer to the line side of an electrical apparatus, such as an arc fault circuit interrupter (AFCI).

As employed herein, the term "downstream" means in the direction to which power flows in a power circuit, in the direction of or nearer to the power output of an electrical apparatus, and/or in the direction of or nearer to the load side of an electrical apparatus, such as an AFCI.

As employed herein, the term "number" means an integer greater than or equal to one.

As employed herein, the term "electrical connector" means any suitable device or mechanism structured to electrically connect a number of electrical conductors to a number of other electrical conductors regardless whether intervening device(s) and/or mechanism(s) (e.g., without limitation, a male plug; a female plug; a wire nut) is (are) employed, whether the electrical conductors are directly electrically connected (e.g., without limitation, through a soldered, welded or brazed electrical connection; through a crimped or other suitable mechanical connection that establishes suitable electrical conductivity between the respective electrical conductors), or whether the electrical conductors are indirectly electrically connected through other electrical conductors.

Figure 1:
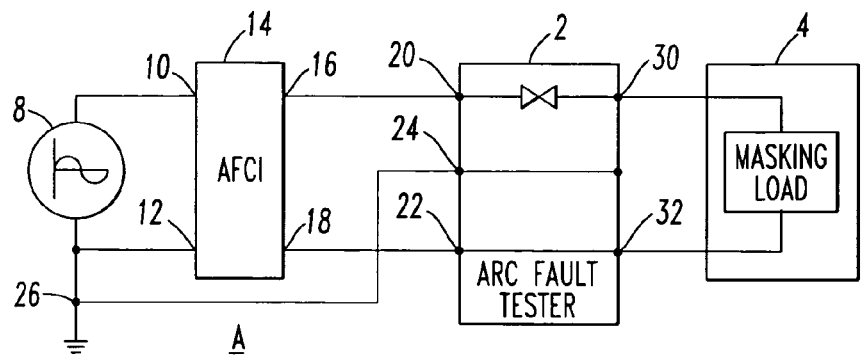
FIGS. 1-4 are block diagrams in schematic form of masking load test configurations.
Figure 2:
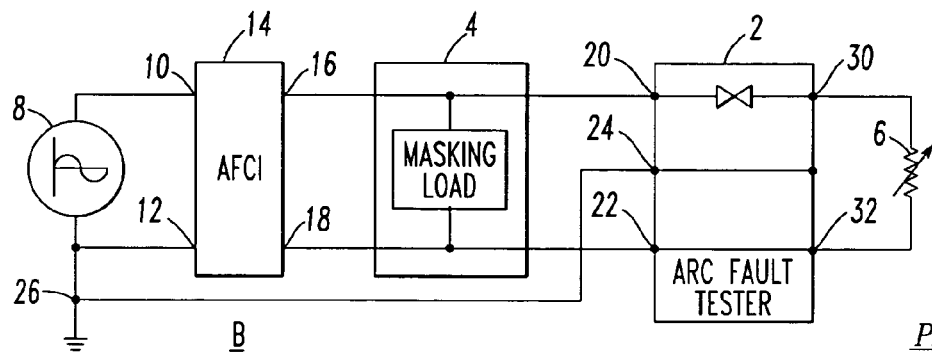
Figure 3:
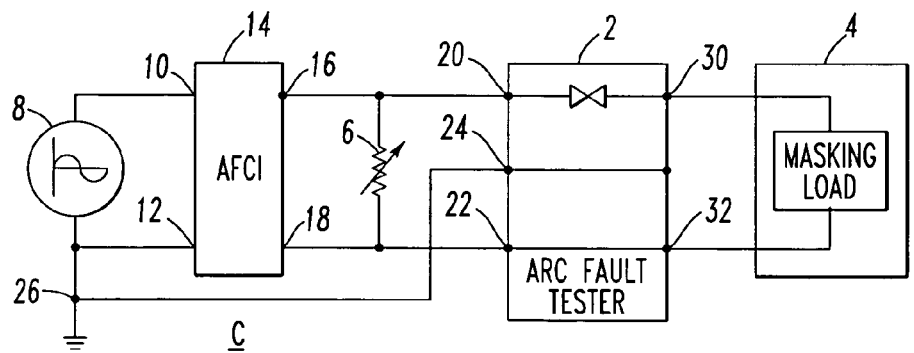
Figure 4:
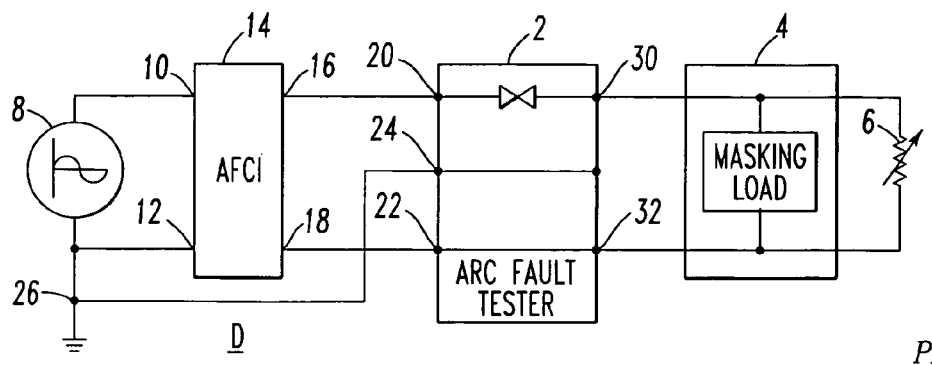
Figure 5:
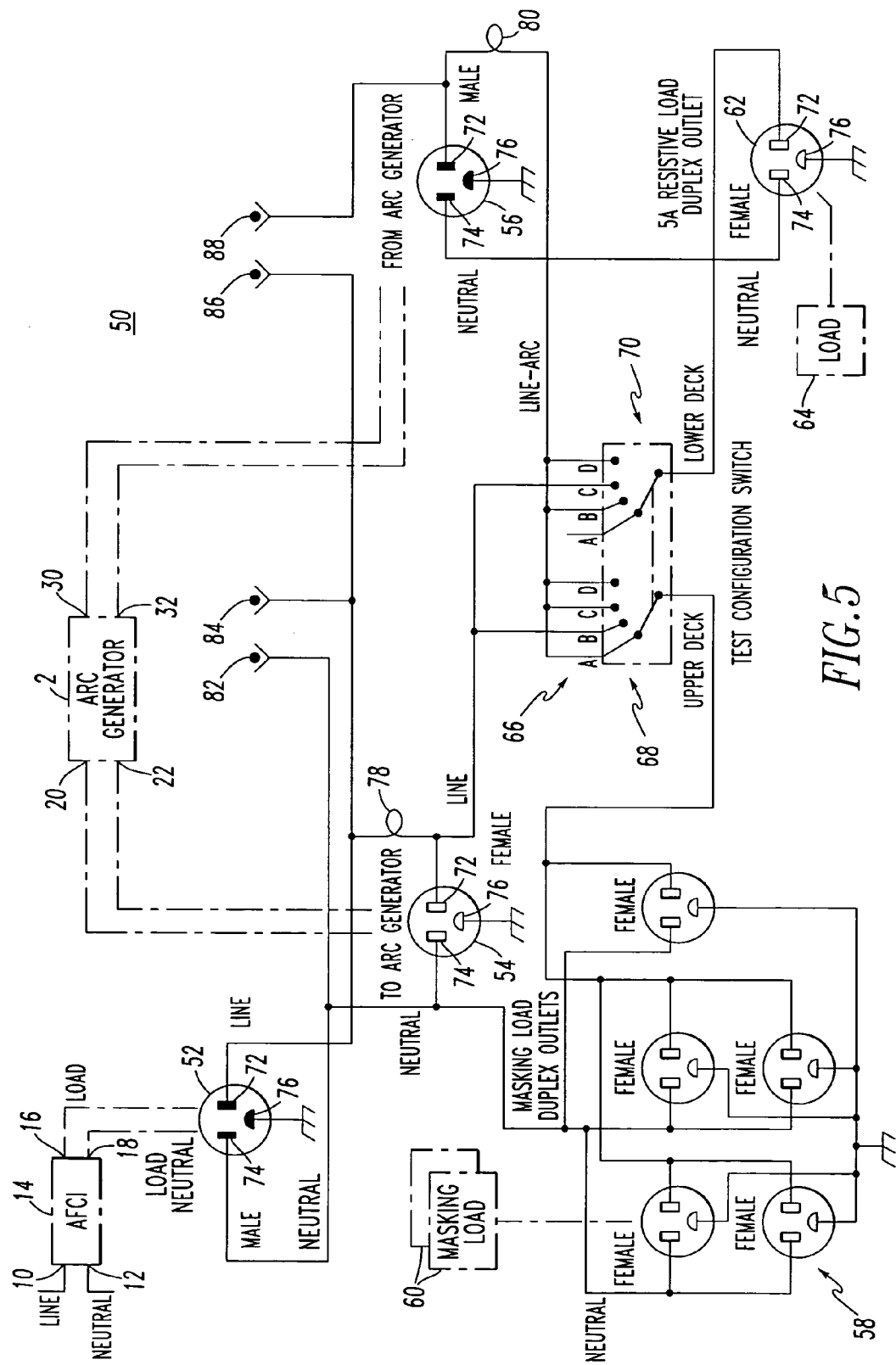
FIG. 5 is a block diagram in schematic form of a test apparatus in accordance with an embodiment of the invention.

Referring to FIG. 5, a test apparatus 50 for testing AFCI 14 (shown in phantom line drawing) with an arc fault generator 2 (shown in phantom line drawing) having an input (e.g., line terminal 20) and an output (e.g., load terminal 30). The test apparatus 50 includes a first electrical connector 52 structured to be electrically connected to the load side of the AFCI 14, a second electrical connector 54 structured to be electrically connected to the input 20 of the arc fault generator 2, a third electrical connector 56 structured to be electrically connected to the output 30 of the arc fault generator 2, a plurality of fourth electrical connectors 58 structured to be electrically connected to at least one of a plurality of masking loads 60 (shown in phantom line drawing), and a fifth electrical connector 62 structured to be electrically connected to another load 64 (shown in phantom line drawing). As will be described, a selector switch 66 is structured to provide a plurality of different configurations of at least the arc fault generator 2 and the at least one of a plurality of masking loads 60 downstream of the load side of the AFCI 14. Although an example two pole, four position selector switch 66 is shown, any suitable mechanism for selecting one of a plurality of different configurations of at least the arc fault generator 2 and one or more of the masking loads 60 downstream of the load side of the AFCI 14 may be employed.

EXAMPLE 1

In this example, the load 64 is a resistive load (e.g., without limitation, a suitable resistance to carry about 5 A at a suitable line voltage of about 110 VAC). The selector switch 66 is structured to provide a plurality of different configurations of the masking loads 60 upstream of the input 20 of the arc fault generator 2 or downstream of the output 30 of the arc fault generator 2, and to provide a plurality of different configurations of the resistive load 64 upstream of the input 20 of the arc fault generator 2, downstream of the output 30 of the arc fault generator 2, or not employed with the arc fault generator 2. The selector switch 66 includes an upper deck 68 and a lower deck 70. In position B of the upper deck 68, the masking load(s) 60 are upstream of the input 20 of the arc fault generator 2, while in positions A, C or D of the upper deck 68, the masking load(s) 60 are downstream of the output 30 of the arc fault generator 2. In position C of the lower deck 70, the resistive load 64 is upstream of the input 20 of the arc fault generator 2. In positions B or D of the lower deck 70, the resistive load 64 is downstream of the output 30 of the arc fault generator 2. In position A of the lower deck 70, the resistive load 64 is not employed with the arc fault generator 2.

EXAMPLE 2

The fourth electrical connectors 58 are structured to be electrically connected to at least one of the masking loads 60. For example, the masking loads 60 include one of: (1) a vacuum cleaner, (2) at least one electronic switching mode power supply, (3) a capacitor start type motor, (4) an electronic lamp dimmer load, and (5) two fluorescent lamps in parallel with a resistive load different from the resistive load 64.

EXAMPLE 3

In position A of the upper and lower decks 68,70 of the selector switch 66, the arc fault generator 2 is electrically connected downstream of the load side of the AFCI 14 and the masking load(s) 60 is(are) electrically connected downstream of the output 30 of the arc fault generator 2.

EXAMPLE 4

In position B of the upper and lower decks 68,70 of the selector switch 66, the masking load(s) 60 is(are) electrically connected downstream of the load side of the AFCI 14, the arc fault generator 2 is electrically connected downstream of the masking load(s) 60, and the resistive load 64 is electrically connected downstream of the output 30 of the arc fault generator 2.

EXAMPLE 5

In position C of the upper and lower decks 68,70 of the selector switch 66, the resistive load 64 is electrically connected downstream of the load side of the AFCI 14, the arc fault generator 2 is electrically connected downstream of the resistive load 64, and the masking load(s) 60 is(are) electrically connected downstream of the output 30 of the arc fault generator 2.

EXAMPLE 6

In position D of the upper and lower decks 68,70 of the selector switch 66, the arc fault generator 2 is electrically connected downstream of the load side of the AFCI 14, the masking load(s) 60 is(are) electrically connected downstream of the output 30 of the arc fault generator 2, and the resistive load 64 is electrically connected downstream of the output 30 of the arc fault generator 2.

EXAMPLE 7

Each of the first and second electrical connectors 52,54 includes a line terminal 72, a neutral terminal 74 and a ground terminal 76. A total current measurement loop 78 is disposed between the line terminals 72 of the first and second electrical connectors 52,54. The total current measurement loop 78 is structured to permit measurement of the total current flowing from the load side of the AFCI 14 by a suitable current probe (not shown).

EXAMPLE 8

The third electrical connector 56 also includes a line terminal 72, a neutral terminal 74 and a ground terminal 76. An arc current measurement loop 80, which is generally similar to the total current measurement loop 78, is disposed between the line terminal 72 of the third electrical connector 56 and the selector switch 66 (LINE-ARC). The arc current measurement loop 80 is structured to permit measurement of arc current flowing from the output 30 of the arc fault generator 2 by a suitable current probe (not shown).

EXAMPLE 9

First and second line voltage test points 82,84 are respectively electrically connected to the line and neutral terminals 72,74 of the first electrical connector 52. The test points 82,84 are structured to permit measurement of the line voltage by a suitable differential voltage probe (not shown).

EXAMPLE 10

A first arc voltage test point 86 is electrically connected to the line terminals 72 of the first and second electrical connectors 52,54. A second arc voltage test point 88 is electrically connected to the output 30 of the arc fault generator 2 through the line terminal 72 of the third electrical connector 56. The test points 86,88 are structured to permit measurement of the arc voltage by a suitable differential voltage probe (not shown).

EXAMPLE 11

The selector switch 66 is a two pole (e.g., upper and lower decks 68,70), four position (e.g., positions A-D) switch including a first pole 68 structured to dispose the masking load(s) 60 upstream of the arc fault generator input 20 or downstream of the arc fault generator output 30. The selector switch 66 also includes a second pole 70 structured to remove the resistive load 64 or to dispose the resistive load 64 upstream of the arc fault generator input 20 or downstream of the arc fault generator output 30. The selector switch 66 selects one of four configurations of at least the arc fault generator 2 and the masking load(s) 60 downstream of the load side of the AFCI 14.

EXAMPLE 12

The neutral terminals 74 of the second and third electrical connectors 54,56 are structured to be electrically connected together by the arc fault generator 2. For example, the output neutral 32 of the arc fault generator 2 and the neutral of the 5 A resistive load 64 (neutral terminal 74 on fifth electrical connector 62) are electrically connected to the other input neutrals of the arc fault generator 2 and the masking load(s) 60 by the arc fault generator 2. For example, the UL 1699 Configurations A-D of FIGS. 1-4, respectively, show the input neutral 22 of the arc fault generator 2 being electrically connected to the output neutral 32 of the arc fault generator 2.

EXAMPLE 13

The first and third electrical connectors 52,56 are three-terminal male plugs. The second, fourth and fifth electrical connectors 54,58,62 are three-terminal female plugs.

EXAMPLE 14

Figure 6:
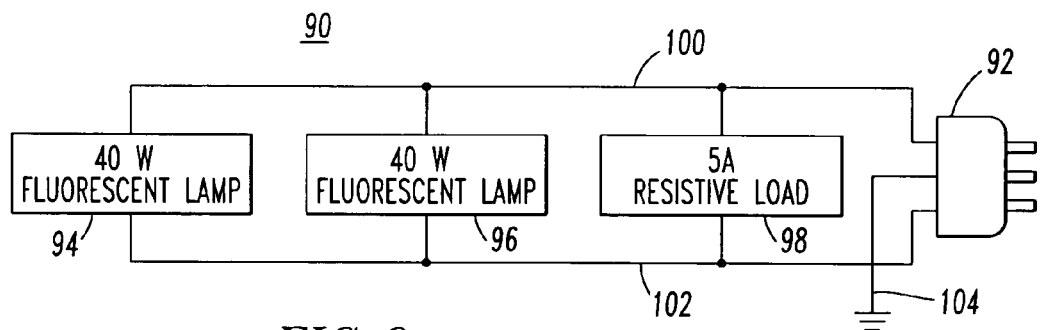
FIGS. 6 and 7 are block diagrams of masking load circuits employable by the test apparatus of FIG. 5.

FIG. 6 shows an example masking load circuit 90 employed by the test apparatus 50 of FIG. 5. The circuit 90 includes a conventional male AC plug 92 that mates with one of the electrical connectors 58 of FIG. 5, two 40 W fluorescent lamps 94,96 plus an additional 5 A resistive load 98. The lamps 94,96 and resistive load 98 are electrically connected in parallel between a line conductor 100 and a neutral conductor 102. As is conventional, the plug 92 receives a ground conductor 104. Alternatively, each of the lamps 94,96 and resistive load 98 may have its own AC plug (not shown). In turn, the three AC plugs (not shown) mate with three of the electrical connectors 58 of FIG. 5.

EXAMPLE 15

Figure 7:
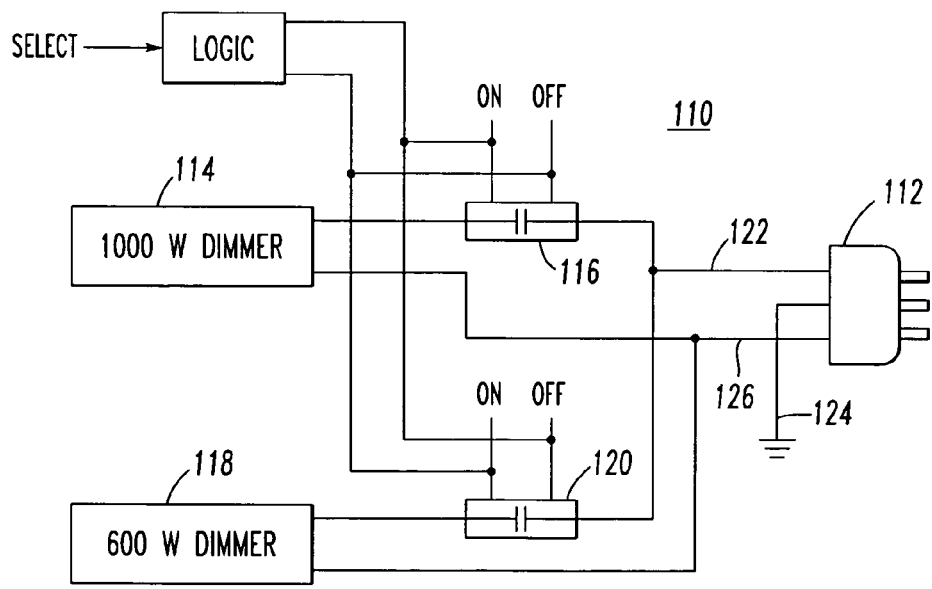

FIG. 7 shows an example masking load circuit 110 employed by the test apparatus 50 of FIG. 5. The circuit 110 includes a conventional male AC plug 112 that mates with one of the electrical connectors 58 of FIG. 5, a first 1000 W dimmer 114 electrically connected in series with a first contactor 116 and a second 600 W dimmer 118 electrically connected in series with a second contactor 120. The first and second contactors 116,118 are structured to electrically connect only one of the first 1000 W dimmer 114 and the second 600 W dimmer 118 to the line conductor 122 of the plug 112. As is conventional, the plug 112 receives a ground conductor 124 and a neutral conductor 126. Alternatively, each of the dimmers 114,118 may have its own AC plug (not shown). In turn, one of those two AC plugs (not shown) mates with one of the electrical connectors 58 of FIG. 5. Alternatively, the two contactors 116,118 may be replaced by one single pole, double throw toggle switch.

EXAMPLE 16

The selector switch 66 cooperates with the first, second, third, fourth and fifth electrical connectors 52,54,56,58,62 to provide UL 1699 operation inhibition tests of the AFCI 14.

EXAMPLE 17

In the disclosed test apparatus 50, the desired test configuration is selected with a rotary selector switch 66 including four example positions, which are preferably clearly labeled (not shown) by their configuration.

EXAMPLE 18

In the disclosed test apparatus 50, other suitable test configurations may be employed wherein the masking load 60 of FIG. 5 is not employed.

The disclosed test apparatus 50 simplifies and expedites masking test load switching, eliminates repetitive activity and reduces the possibility of error in testing AFCIs, such as AFCI 14.

While specific embodiments of the invention have been described in detail, it will be appreciated by those skilled in the art that various modifications and alternatives to those details could be developed in light of the overall teachings of the disclosure. Accordingly, the particular arrangements disclosed are meant to be illustrative only and not limiting as to the scope of the invention which is to be given the full breadth of the claims appended and any and all equivalents thereof.

What is claimed is:

1. An apparatus for testing an arc fault circuit interrupter with an arc fault generator having an input and an output, said arc fault circuit interrupter having a line side and a load side downstream of said line side, said apparatus comprising:
   a first electrical connector structured to be electrically connected to the load side of said arc fault circuit interrupter;
   a second electrical connector structured to be electrically connected to the input of said arc fault generator;
   a third electrical connector structured to be electrically connected to the output of said arc fault generator;
   a plurality of fourth electrical connectors structured to be electrically connected to at least one of a plurality of masking loads;
   a fifth electrical connector structured to be electrically connected to another load; and
   a selector switch structured to provide a plurality of different configurations of at least said arc fault generator and said at least one of a plurality of masking loads downstream of the load side of said arc fault circuit interrupter.

2. The apparatus of claim 1 wherein said another load is a resistive load; and wherein said selector switch is structured to provide a plurality of different configurations of said masking loads being upstream of the input of said arc fault generator or downstream of the output of said arc fault generator, and a plurality of different configurations of said resistive load being upstream of the input of said arc fault generator, downstream of the output of said arc fault generator, or not employed with said arc fault generator.

3. The apparatus of claim 1 wherein said another load is a first resistive load; and wherein said fourth electrical connectors are structured to be electrically connected to one of a vacuum cleaner, at least one electronic switching mode power supply, a capacitor start type motor, an electronic lamp dimmer load, and two fluorescent lamps in parallel with a second resistive load.

4. The apparatus of claim 1 wherein said another load is a resistive load; and wherein said fifth electrical connector is structured to be electrically connected to said resistive load.

5. The apparatus of claim 1 wherein said selector switch is structured to electrically connect said arc fault generator downstream of the load side of said arc fault circuit interrupter and to electrically connect said at least one of a plurality of masking loads downstream of the output of said arc fault generator.

6. The apparatus of claim 1 wherein said another load is a resistive load; and wherein said selector switch is structured to electrically connect said at least one of a plurality of masking loads downstream of the load side of said arc fault circuit interrupter, to electrically connect said arc fault generator downstream of said at least one of a plurality of masking loads and to electrically connect said resistive load downstream of the output of said arc fault generator.

7. The apparatus of claim 1 wherein said another load is a resistive load; and wherein said selector switch is structured to electrically connect said resistive load downstream of the load side of said arc fault circuit interrupter, to electrically connect said arc fault generator downstream of said resistive load and to electrically connect said at least one of a plurality of masking loads downstream of the output of said arc fault generator.

8. The apparatus of claim 1 wherein said another load is a resistive load; and wherein said selector switch is structured to electrically connect said arc fault generator downstream of the load side of said arc fault circuit interrupter, to electrically connect said at least one of a plurality of masking loads downstream of the output of said arc fault generator and to electrically connect said resistive load downstream of the output of said arc fault generator.

9. The apparatus of claim 1 wherein each of said first and second electrical connectors includes line, neutral and ground terminals; and wherein a current measurement loop is disposed between the line terminals of said first and second electrical connectors, said current measurement loop being structured to permit measurement of current flowing from the load side of said arc fault circuit interrupter.

10. The apparatus of claim 9 wherein said third electrical connector includes line, neutral and ground terminals; and wherein another current measurement loop is disposed between the line terminal of said third electrical connector and said selector switch, said other current measurement loop being structured to permit measurement of arc current flowing from the output of said arc fault generator.

11. The apparatus of claim 1 wherein said first electrical connector includes line, neutral and ground terminals; and wherein first and second line voltage test points are respectively electrically connected to the line and neutral terminals of said first electrical connector.

12. The apparatus of claim 11 wherein said second and third electrical connectors include said line, neutral and ground terminals; wherein a first arc voltage test point is electrically connected to the line terminals of said first and second electrical connectors; and wherein a second arc voltage test point is electrically connected to the output of said arc fault generator.

13. The apparatus of claim 1 wherein said another load is a resistive load; and wherein said selector switch is a two pole, four position switch including a first pole structured to dispose said at least one of a plurality of masking loads upstream of the input or downstream of the output of said arc fault generator, and a second pole structured to remove said resistive load or to dispose said resistive load upstream of the input or downstream of the output of said arc fault generator, said two pole, four position switch being structured to select one of four configurations of at least said arc fault generator and said at least one of a plurality of masking loads downstream of the load side of said arc fault circuit interrupter.

14. The apparatus of claim 1 wherein each of said second and third electrical connectors includes line, neutral and ground terminals; and wherein the neutral terminals of said second and third electrical connectors are structured to be electrically connected together by said arc fault generator.

15. The apparatus of claim 1 wherein each of said first, second, third, fourth and fifth electrical connectors includes line, neutral and ground terminals; wherein said first electrical connector is a three-terminal male plug; wherein said second electrical connector is a three-terminal female plug; wherein said third electrical connector is a three-terminal male plug; wherein said fourth electrical connectors are three-terminal female plugs; and wherein said fifth electrical connector is a three-terminal female plug.

16. The apparatus of claim 1 wherein one of said fourth electrical connectors is structured to be electrically connected to the series combination of one of a first 1000 W dimmer electrically connected in series with a first contactor and a second 600 W dimmer electrically connected in series with a second contactor; and wherein said first and second contactors are structured to electrically connect only one of said first 1000 W dimmer and said second 600 W dimmer to said one of said fourth electrical connectors.

17. The apparatus of claim 1 wherein said selector switch cooperates with said first, second, third, fourth and fifth electrical connectors to provide UL 1699 operation inhibition tests of said arc fault circuit interrupter.

18. An apparatus for testing an arc fault circuit interrupter with an arc fault generator having an input and an output, said arc fault circuit interrupter having a line side and a load side downstream of said line side, said apparatus comprising:
- a first electrical connector structured to be electrically connected to the load side of said arc fault circuit interrupter;
- a second electrical connector structured to be electrically connected to the input of said arc fault generator;
- a third electrical connector structured to be electrically connected to the output of said arc fault generator;
- a plurality of fourth electrical connectors structured to be electrically connected to at least one of a plurality of masking loads;
- a fifth electrical connector structured to be electrically connected to another load; and
- means for selecting one of a plurality of different configurations of at least said arc fault generator and said at least one of a plurality of masking loads downstream of the load side of said arc fault circuit interrupter.

19. The apparatus of claim 18 wherein said another load is a resistive load; and wherein said means for selecting is a two pole, four position switch including a first pole structured to dispose said at least one of a plurality of masking loads upstream of the input or downstream of the output of said arc fault generator, and a second pole structured to remove said resistive load or to dispose said resistive load upstream of the input or downstream of the output of said arc fault generator, said two pole, four position switch being structured to select one of four configurations of at least said arc fault generator and said at least one of a plurality of masking loads downstream of the load side of said arc fault circuit interrupter.

20. The apparatus of claim 18 wherein said another load is a resistive load; and wherein said selector switch is structured to provide a plurality of different configurations of said masking loads being upstream of the input of said arc fault generator or downstream of the output of said arc fault generator, and a plurality of different configurations of said resistive load being upstream of the input of said arc fault generator, downstream of the output of said arc fault generator, or not employed with said arc fault generator.

21. An apparatus for testing an arc fault circuit interrupter with an arc fault generator having an input and an output, said arc fault circuit interrupter having a line side and a load side downstream of said line side, said apparatus comprising:
- a first electrical connector structured to be electrically connected to the load side of said arc fault circuit interrupter;
- a second electrical connector structured to be electrically connected to the input of said arc fault generator;
- a third electrical connector structured to be electrically connected to the output of said arc fault generator;
- a fourth electrical connector structured to be electrically connected to a resistance; and
- a selector switch structured to provide a plurality of different configurations of at least said arc fault generator and said resistance downstream of the load side of said arc fault circuit interrupter.

* * * * *